US006911919B2

(12) United States Patent
Wiesenauer

(10) Patent No.: US 6,911,919 B2
(45) Date of Patent: Jun. 28, 2005

(54) OPERATING DEVICE FOR AN IN-CAR COMPUTING SYSTEM AND IN-CAR COMPUTING SYSTEM

(75) Inventor: Bernd Wiesenauer, Filderstadt (DE)

(73) Assignee: CAA AG, Filderstadt (DE)

( * ) Notice: Subject to any disclaimer, the term of this patent is extended or adjusted under 35 U.S.C. 154(b) by 0 days.

(21) Appl. No.: 10/185,173

(22) Filed: Jun. 28, 2002

(65) Prior Publication Data

US 2003/0016208 A1 Jan. 23, 2003

(30) Foreign Application Priority Data

Jun. 29, 2001 (DE) ........................................ 101 31 039

(51) Int. Cl.[7] ............................................ H03M 11/00

(52) U.S. Cl. ......................... 341/20; 345/157; 345/161; 345/701; 74/471 XY; 341/35; 463/38

(58) Field of Search ................................ 345/701, 161, 345/160, 157; 341/20, 95; 74/471 XY; 463/38

(56) References Cited

U.S. PATENT DOCUMENTS

| | | | | |
|---|---|---|---|---|
| 5,621,196 A | | 4/1997 | Nishijima et al. | |
| 5,903,257 A | * | 5/1999 | Nishiumi et al. ........... | 345/157 |
| 6,208,328 B1 | * | 3/2001 | Kawachiya et al. ........ | 345/157 |
| 6,259,382 B1 | * | 7/2001 | Rosenberg ................... | 341/20 |

FOREIGN PATENT DOCUMENTS

| | | |
|---|---|---|
| DE | 196 39 119 A1 | 3/1998 |
| DE | 197 12 048 A1 | 9/1998 |
| DE | 197 32 287 A1 | 1/1999 |
| DE | 199 26 521 A1 | 12/2000 |
| DE | 100 21 895 A1 | 2/2001 |
| DE | 100 02 493 C1 | 6/2001 |

* cited by examiner

*Primary Examiner*—Albert K. Wong
(74) *Attorney, Agent, or Firm*—Harness, Dickey & Pierce P.L.C.

(57) ABSTRACT

The present invention relates to an operating device for an in-car computing system (10) for controlling a selection mark (cursor), comprising an operating body (32) which is hold pivotally around an axis (36) (pivot axis) as to implement first and second switching functions, and a handle ridge (38) passing through said pivot axis (36), characterized in that the rotation of the operating body (32) is limited to an angle of ±90° relative to its normal position;

a resetting means is provided for resetting said operating body (32) in its normal position;

said operating body (32) is movable towards the pivot axis (36) as to implement a third switching function, and said operating body (32) is provided tiltably around an axis (45) being parallel to said handle ridge (38) as to implement fourth and fifth switching functions.

8 Claims, 1 Drawing Sheet

OPERATING DEVICE FOR AN IN-CAR COMPUTING SYSTEM AND IN-CAR COMPUTING SYSTEM

CROSS-REFERENCES TO RELATED APPLICATION

This application claims priority of German patent application DE 101 31 039 filed Jun. 29, 2001.

BACKGROUND OF THE INVENTION

The present invention relates to an operating device for an in-car computing system for controlling a selection mark (cursor), comprising an operating body which is pivotally arranged about an axis (pivot axis) as to implement first and second switching functions, and a handle ridge passing said pivot axis. The invention further relates to an in-car computing system.

In-car computing systems are generally known. More and more, such in-car computing systems are built into modern vehicles as to implement different car-specific and car-unspecific applications, like navigation, telephone, audio and video etc. The selection of these applications is made via selection menus which are displayed on a display screen of the in-car computing system and which may be selected by means of operating devices. Due to the plurality of different applications, the selection menu comprises a plurality of menu levels (hierarchy levels) and a plurality of individual menu items within each menu level. If a user of the in-car computing system likes to select a particular application, it is sometimes necessary to navigate through a great number of menu levels as to reach the desired menu item at the end. Such a navigation through a selection menu requires increased attention of the user which, however, does not pose any problems under normal circumstances. However, in a vehicle, the operation makes high demands, particularly the attention of the user may not be distracted. This is true not only for displaying and organizing the selection menus, but to a great degree also for the operating device provided for making the selection. The known operating devices such as rotary switch buttons are not able to meet the increased demand caused by the increased number of selectable functions.

Control or operating devices employed in vehicles are for example disclosed in DE 100 02 493 C1, DE 197 32 287 A1 or DE 199 26 521 A1. Further, a force-feedback joystick is disclosed in DE 100 21 895 A1. A bi-directional rotary switch is e.g. disclosed in DE 196 39 119 A1.

SUMMARY OF THE INVENTION

In view of the above, the object of the present invention is to provide an operating device which allows a simple and ergonomic operation of an in-car system, particularly movement of a selection mark (cursor) within a selection menu.

This object is solved in the operating device as mentioned in the outset such that the rotation of the operating body is limited to an angle of ±90° relative to its normal position, a resetting means is provided for resetting said operating body in its normal position, said operating body is movable towards the pivot axis as to implement a third switching function, and said operating body is tiltably arranged around an axis being parallel to said handle ridge as to implement fourth and fifth switching functions.

This means with other words that the operating device allows at least five switching functions wherein the operation is simple and ergonomic. Particularly, the most frequently used switching functions, namely the first and second switching functions may be reached fast and safe by means of the relatively large handle ridge so that the user does not have to direct his view to the operating device necessarily. The resetting means promotes the movement of the selection mark from one menu item to the other by resetting the operating body in its normal position continuously. Therefore, the user has the possibility to reach single menu items by operating and releasing the operating device a plurality of times without having optical contact to the display screen.

In a preferred embodiment, the sixth and seventh switching functions are activated when reaching one of both end positions of the angle range and holding the operating body there, respectively.

This measure has the advantage that the number of possible switching functions is increased, however, without increasing the number of operating devices to the same extent.

In a preferred embodiment, a force applying device is provided which applies a force to the operating body as to avoid a rotation in at least one direction.

This measure has the advantage that the operation is further simplified. Particularly, the user obtains a specific information by locking the rotation of the operating body, particularly the information that the end of a list of menu items is reached. The user obtains this information without having to direct his view to the display screen in the vehicle.

In a preferred embodiment, the operating body has a disk-shaped form and extends radially across the diameter of the operating body.

This measure results in a most preferred design of the operating device.

The object underlying the present invention is also solved by an in-car computing system, in which single functions are activated dependent on the selection of single menu items within a hierarchical structured selection menu, by providing an operating device according to the present invention. The operating device allows to move the selection mark (cursor) between individual menu items in a hierarchical level of the selection menu by means of the first and second switching functions, the change of the hierarchical level of the selection menu is achieved by means of the fourth and fifth switching functions and the selection of a menu item is achieved by means of the third switching function.

This in-car computing system enables a simple and fast navigation within different menu levels of a selection menu, and hence the simple selection of menu items by using the operating device according to the present invention, without having to focus his attention to the operation of the operating device.

Further advantages and embodiments of the present invention will be apparent from the description and the enclosed drawings.

It is to be understood that the features mentioned above and those yet to be explained below can be used not only in the respective combination indicated, but also in other combinations or in isolation, without leaving the scope of the present invention.

BRIEF DESCRIPTION OF THE DRAWINGS

An embodiment of the invention is shown in the drawings and will be explained in more detail in the description below with reference to same. In the drawings.

DETAILED DESCRIPTION OF PREFERRED EMBODIMENTS

Figure 1:
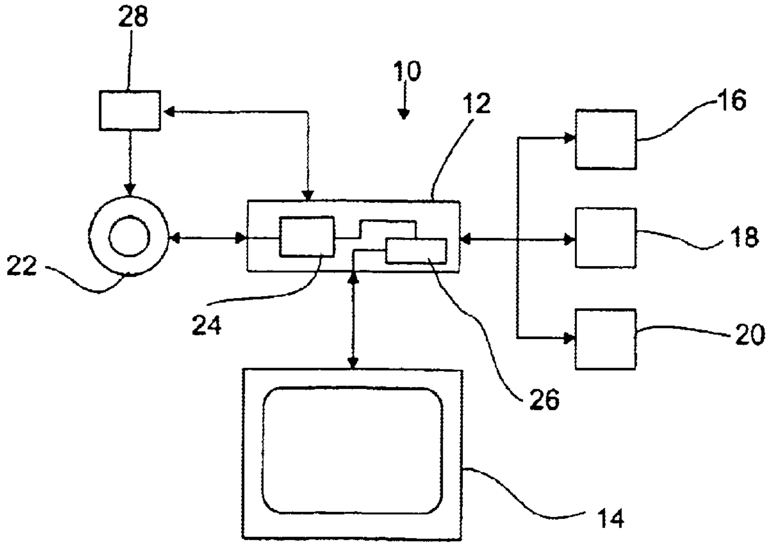
FIG. 1 is a schematic view of an in-car computing system.

In FIG. 1, an in-car computing system for a vehicle is schematically shown and indicated with reference numeral 10. The in-car computing system 10 comprises a computer unit 12 which is for example an ordinary PC adapted to the demands in a vehicle. The assignee of the present application offers such a computer unit 12 under the name "CarPC".

A plurality of different components are coupled with this computer unit 12 as to exchange data with each other. The in-car computing system 10 comprises a display screen 14, which is provided preferably as a LCD screen and is embedded in the dashboard of a vehicle. The display screen 14 serves to display data and selection menus which allow the control of the in-car computing system 10.

Further components coupled to the computer unit 12 are for example a navigation system 16, a telephone system 18 and an Internet communications system 20. The design of these components 16 to 20 is known per se so that a detailed description of these components is omitted.

These components 16 to 20 exchange data with the computer unit 12 and are controlled by the computer unit 12. An operating device 22 serves to input information and to select particular menu items of the selection menu displayed on the display screen 14, the operating device being described in more detail below.

The computer unit 12 further comprises a control unit 24 which carries out the control of the data flow as well as the processing of predetermined programs. A driver unit 26 is provided for driving the display screen 14, the driver unit receiving the respective data from the control unit 24.

The in-car computing system 10 further comprises a force applying device 28 which is also known under the name "force feedback devices". This force applying device 28 is coupled with the operating device 22 and applies an actuating force counteracting the force applied by the user, as to prevent a particular operation of the operating device. The force applying device 28 is driven by signals of the computer unit 12 which supplies control signals to the force applying device 28 responsive to predetermined criteria.

Figure 2A:
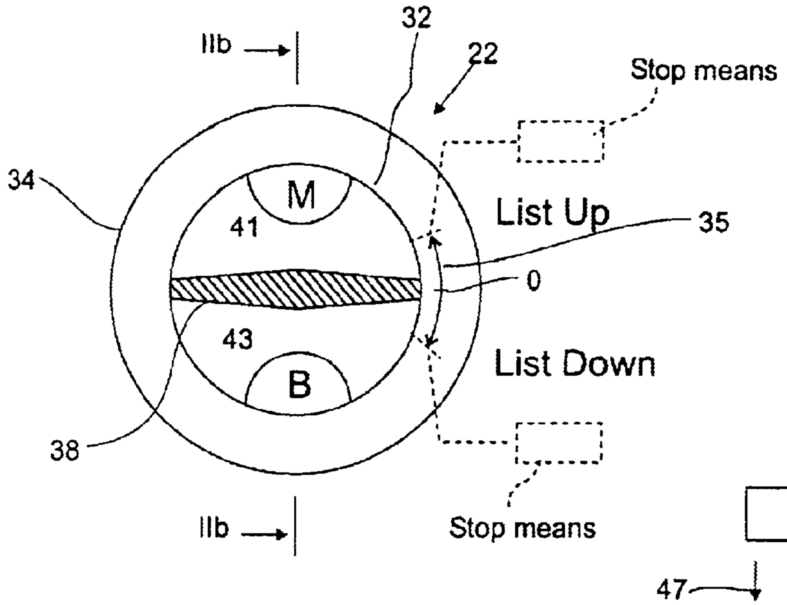
FIG. 2*a* is a schematic plan view of an operating device according to the present invention.
Figure 2B:
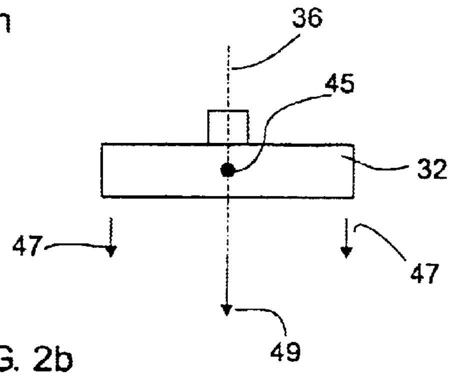
FIG. 2*b* is a schematic sectional view along line IIb—IIb of FIG. 2*a* of the operating device.

Referring to FIGS. 2*a* and 2*b*, the structure of the operating device 22 and its function will be described below.

The operating device 22 comprises an operating body 32 which has a disk-shaped form. The operating body 32 is pivotally arranged within a frame or casing 34 and is rotatable around its longitudinal axis 36. The range within which the operating body 32 is rotatable is limited by respective stop means, which is indicated by an arrow 35. The angle range is approximately ±20° starting from a normal position indicated with "0". Of course, the angle range may be adapted to the respective needs, however, should not exceed ±45° due to ergonomic reasons.

For rotating and pivoting the operating body 32 about the axis 36, respectively, a handle ridge is provided which is indicated with reference numeral 38 and :shown with broken lines. This handle ridge 38 extends across the whole diameter of the operating body 32 in a radial direction so that the handle ridge 38 passes the pivot axis 36. The handle ridge 38 therefore divides the area shown in FIG. 2*a* into an upper section 41 and a lower section 43. By means of the handle ridge 38, the operating body 32 may be pivoted in a simple manner about the axis 36 within the predetermined angle range. This pivot movement is transferred to a switching element not shown to implement first and second switching functions.

The operating body 32 is also arranged tiltably about an axis 45 (FIG. 2*b*) within the frame 34. This axis 45 (tilt axis) extends perpendicular to the tilt axis 36 and parallel to the handle ridge 38. This arrangement allows the operating body 32 to be tilted about the axis 45 by applying an actuating force to one of both sections 41, 43, what is indicated with arrow 47, for example.

This tilt movement about the tilt axis 45 is transferred to switching elements not shown which implement fourth and fifth switching functions.

In addition to the above-mentioned movement capability of the operating body 32, a further possibility of moving the operating body 32 parallel in the direction of the tilt axis 36 is provided, indicated in FIG. 2*b* by an arrow 49. That is with other words that the operating body 32 may be moved by pushing or pressing it. The movement is transferred to a further switching element, which is also not shown, as to implement a third switching function.

To sum up, the operating body 32 of the operating device 22 is pivotally arranged about the pivot axis 36 within a predetermined angle range, is movable in a direction of the pivot axis 36 and is tiltable about the tilt axis 45 by applying an actuating force to one of the sections 41, 43. These possibilities of movement and adjustment, respectively, allow to implement five switching functions with one single device operating.

As mentioned before, the force applying device 28 serves to counteract an actuating force applied by the user when operating the operating device. In the present embodiment, the force counteracts the actuating force which would otherwise cause a rotation about the pivot axis 36. That is, the operating body 32 may not be pivoted in one or both rotational directions if the counter force is selected large enough.

The force applying device may be of course applied to other movements of the operating body 32.

The operating device 22 allows to control the in-car computing system in the following manner:

As already mentioned, individual functions of the in-car computing system are selected by moving a selection mark (cursor) on the respective menu item and then by confirming this menu item. With the help of the operating device 22, the cursor may be moved for navigation through the selection menu which comprises at least several menu levels.

If several menu items are displayed on the display screen 14, the cursor may be moved within such a list of individual menu items by shortly pivoting the operating body 32 about the pivot axis 36. The provided resetting device resets the operating body 32 back into the normal position after the actuation of the operating body. The direction of the cursor movement (namely an upper or lower, a left or right direction) may Be selected by means of the rotational direction. Pivoting the operating body 32 counterclockwise results for example in a cursor movement within the list in an upward direction, whereas pivoting clockwise moves the cursor within the list downwardly. Hence, the first and second switching functions of the operating device 22 serves to move the cursor from menu item to menu item.

If the user intends to skip the menu items displayed on the display screen and to reach the menu items of the next page, the user holds the operating body 32 in its upper or lower end position. The computer unit 12 detects this holding (first or second switching function) and causes a jump to the next page.

When the user reaches the desired menu item, he may select this menu item and the function associated therewith by pushing the operating body 32 in the direction of the pivot axis 36. This actuation initiates the third switching function.

In order to reach different menu levels, the fourth and fifth switching functions are provided which are achieved by pushing any of both sections 41, 43 causing a tilt of the operating body 32 about the axis 45. Pushing the lower section 43 causes the cursor to jump to the next higher menu level, whereas pushing the upper section causes return to the main menu level.

As to simplify the operation for the user, the force applying device 28 locks a pivot movement of the operating body 32 in one of both directions when the cursor reaches the end of the list of menu items.

This locking of switching functions of the operating device 22 may be of course also implemented for other switching functions, for example the fifth switching function which is achieved by pushing the lower section 43. When the tilt movement of the operating body 32 is locked, the user obtains haptically the information lock that the cursor is already in the main menu level.

To sum up, it is apparent that the operating device 22 allows a plurality of operating possibilities which simplify the navigation within a selection menu, particularly because the user has a central operating device and is therefore not urged to change between different operating devices. Even though the design of the single operating device 22 is simple.

What is claimed is:

1. Operating device for an in-car computing system for controlling a selection mark (cursor), comprising an operating body which is held pivotally around an axis (pivot axis) interacting with a first and a second switching element, respectively, for implementing first and second switching functions, and a handle ridge passing through said pivot axis, wherein stop means are provided for limiting the rotation of the operating body within an angle range of ±90° relative to its normal position;

said operating body is adapted to be movable towards the pivot axis and to interact with a third switching element for implementing a third switching function, and said operating body is adapted to be tiltable around an axis being parallel to said handle ridge and to interact with a fourth and a fifth switching element, respectively, for implementing fourth and fifth switching functions.

2. Operating device of claim 1, wherein a sixth and a seventh switching element for implementing sixth and seventh switching functions, respectively, are provided such that the switching elements are actuated upon reaching and holding said operating body in its end position of the angle range.

3. Operating device of claim 1, wherein a force applying device is provided applying a force to said operating body to avoid rotation in at least one direction.

4. Operating device of claim 1, wherein said operating body has a disc-shaped form and said handle ridge extends radially across the diameter of said operating body.

5. In-car computing system comprising a processing device for activating single functions depending on the selection of single menu items within a hierarchical structured selection menu, wherein said operating device comprises:

an operating body which is held pivotally around an axis (pivot axis) interacting with a first and a second switching element, respectively, for implementing first and second switching functions, and a handle ridge passing through said pivot axis, wherein stop means are provided for limiting the rotation of the operating body within an angle range of ±90° relative to its normal position; said operating body is adapted to be movable towards the pivot axis and to interact with a third switching element for implementing a third switching function, and said operating body is adapted to be tiltable around an axis being parallel to said handle ridge and to interact with a fourth and a fifth switching element, respectively, for implementing fourth wherein said operating body controls a fifth switching functions; and selection mark that is movable between individual menu items of a hierarchical level of said selection menu by means of said first and second switching functions, a change of the hierarchical level of said selection menu is achieved by means of said fourth and fifth switching functions, and the selection of a menu item is achieved by means of said third switching function.

6. In-car computing system of claim 5, wherein a sixth and a seventh switching element for implementing sixth and seventh switching functions, respectively, are provided such that the switching elements are actuated upon reaching and holding said operating body in its end position of the angle range.

7. In-car computing system of claim 5, wherein a force applying device is provided applying a force to said operating body to avoid rotation in at least one direction.

8. In-car computing system of claim 5, wherein said operating body has a disc-shaped form and said handle ridge extends radially across the diameter of said operating body.

* * * * *

UNITED STATES PATENT AND TRADEMARK OFFICE

CERTIFICATE OF CORRECTION

PATENT NO. : 6,911,919 B2
DATED : June 28, 2005
INVENTOR(S) : Bernd Wiesenauer

It is certified that error appears in the above-identified patent and that said Letters Patent is hereby corrected as shown below:

Column 6,
Lines 31-32, "wherein said operating body controls a fifth switching function; and" should read -- and fifth switching functions wherein said operating body controls a --.

Signed and Sealed this

Fifteenth Day of November, 2005

JON W. DUDAS
*Director of the United States Patent and Trademark Office*